(12) United States Patent
Bonsels et al.

(10) Patent No.: US 7,557,614 B1
(45) Date of Patent: Jul. 7, 2009

(54) TOPOLOGY FOR A N-WAY XOR/XNOR CIRCUIT

(75) Inventors: Stefan Bonsels, Stuttgart (DE); Martin Padeffke, Hildrizhausen (DE); Tobias Werner, Weil im Schoenbuch (DE); Alexander Woerner, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/173,569

(22) Filed: Jul. 15, 2008

(51) Int. Cl.
*H03K 19/21* (2006.01)

(52) U.S. Cl. .......................... 326/55; 326/54
(58) Field of Classification Search .............. 326/52–55
See application file for complete search history.

(56) References Cited

U.S. PATENT DOCUMENTS

| | | | |
|---|---|---|---|
| 4,006,365 A | 2/1977 | Marzin et al. | |
| 4,160,919 A | 7/1979 | Curtice | |
| 4,484,091 A | 11/1984 | Nagano | |
| 4,718,035 A | 1/1988 | Hara et al. | |
| 4,749,887 A | 6/1988 | Sanwo et al. | |
| 4,764,886 A | 8/1988 | Yano | |
| 4,831,579 A | 5/1989 | Hara et al. | |
| 4,870,305 A | 9/1989 | Rocchi | |
| 5,457,391 A | 10/1995 | Shimizu et al. | |
| 5,568,067 A | 10/1996 | McDermott et al. | |
| 5,576,637 A | 11/1996 | Akaogi et al. | |
| 6,137,309 A * | 10/2000 | Couteaux et al. | 326/55 |
| 6,297,668 B1 | 10/2001 | Schober | |
| 6,727,728 B1 | 4/2004 | Bitting | |
| 7,231,572 B2 | 6/2007 | Clark | |
| 7,298,171 B2 | 11/2007 | Parris | |

FOREIGN PATENT DOCUMENTS

JP 05167435 A * 7/1993

* cited by examiner

*Primary Examiner*—James Cho
(74) *Attorney, Agent, or Firm*—Oppenheimer Wolff & Donnellly LLP

(57) ABSTRACT

A method for configuring a n-way XOR/XNOR circuit comprises providing a plurality of top stacks of PFETs each including at least three PFETs electrically connected between a high logic level and an output logic connection, providing a plurality of bottom stacks of NFETs each including at least three NFETs electrically connected between a low logic level and the output logic connection, connecting a source or a drain of the outermost PFET in each top stack to a source or a drain of a corresponding NFET in each bottom stack to generate inverted logic signals, inputting at least three input logic states to the stacks of PFETs to selectively connect or disconnect the output logic connection to the high logic level, inputting at least three input logic states to the stacks of NFETs to selectively connect or disconnect the output logic connection to the low logic level, and outputting a logic signal from the output logic connection.

1 Claim, 6 Drawing Sheets

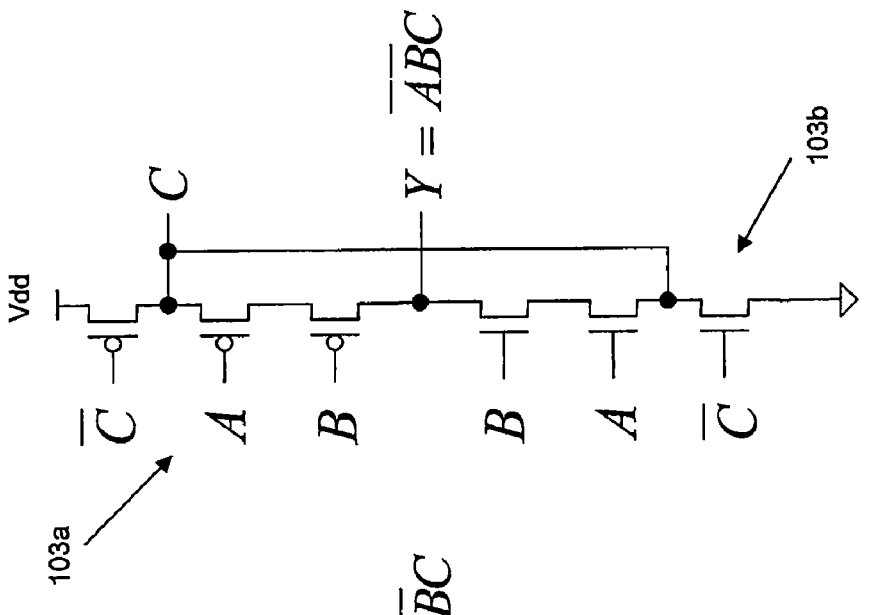
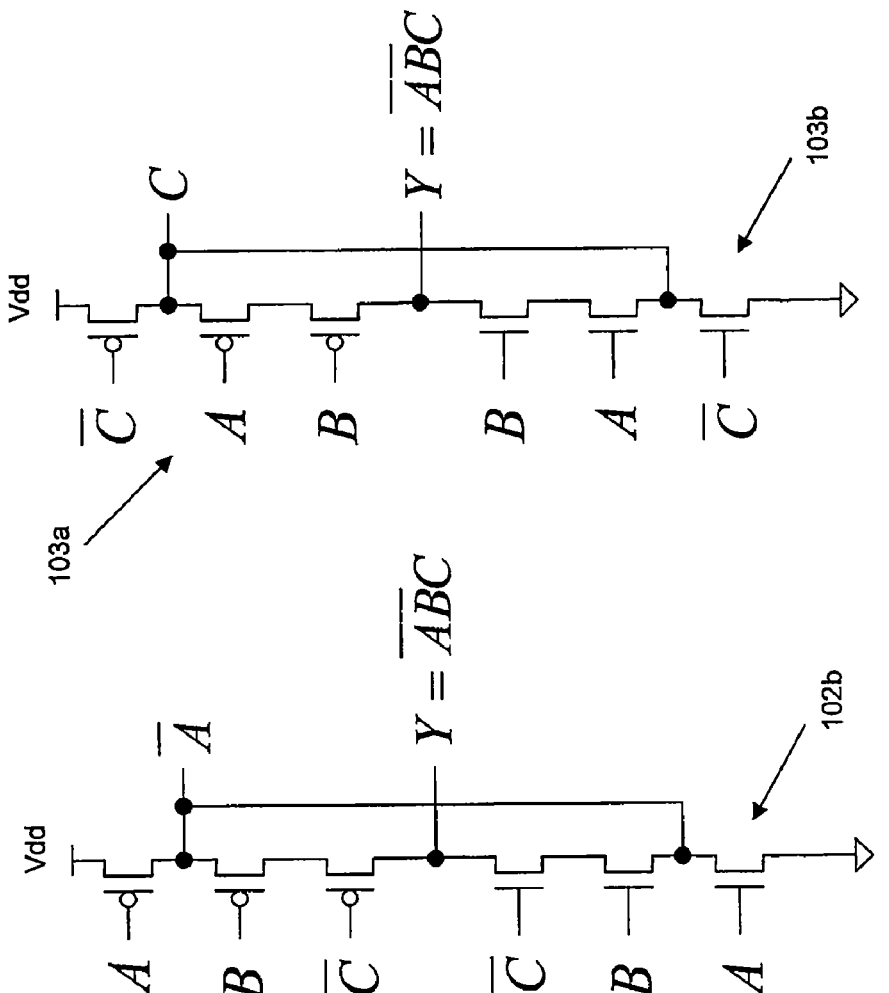
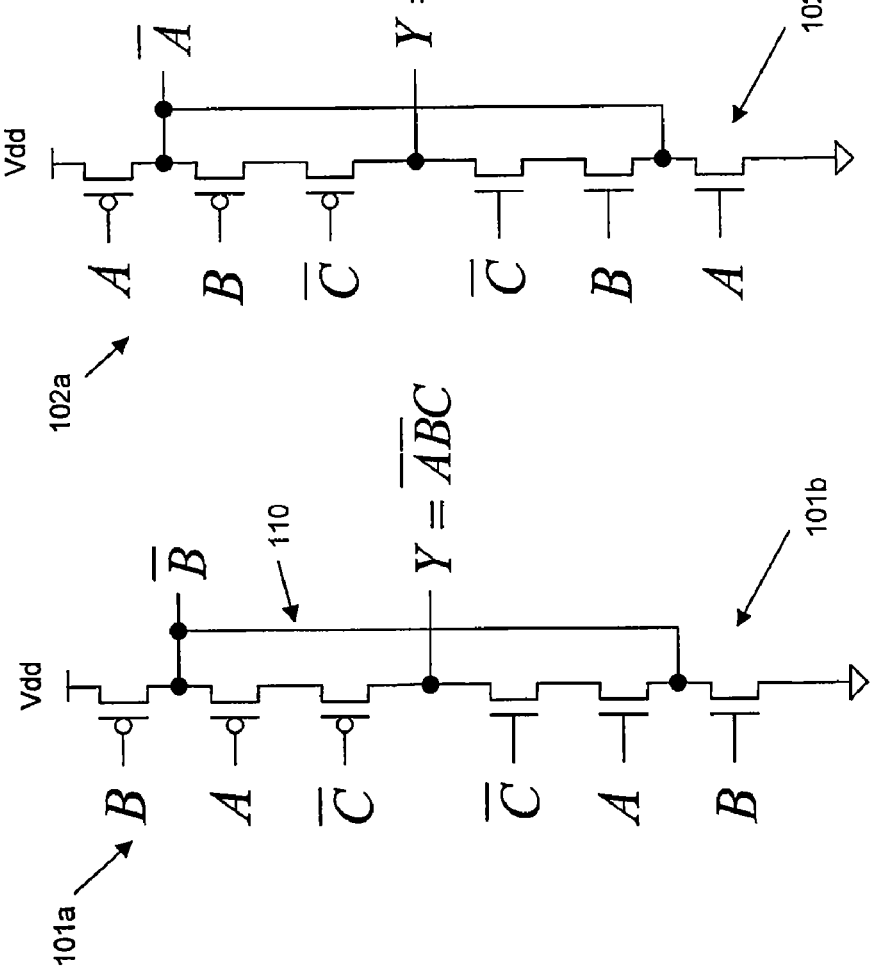

TOPOLOGY FOR A N-WAY XOR/XNOR CIRCUIT

FIELD OF THE INVENTION

The present invention generally relates to the field of logic operations in circuits. In particular, the present invention is directed to a new topology to implement n-way XOR/XNOR circuitry.

BACKGROUND OF THE INVENTION

The electronics industry is continuously increasing the amount of logic circuits needed to fulfill advanced tasks which has lead to complex topologies for multi-input logic circuits. For example, common practice for doing n-way (n-input) XOR/XNOR logic gates (while n>=3) is to use a number of cascaded stages of 2-way XOR/XNOR circuits in which the output of one XOR or XNOR stage is serially connected to the input of a subsequent XOR or XNOR stage. An example of such cascaded XOR gates is described in U.S. Pat. No. 7,231,572 B2 to Clark, which teaches constructing an XOR logic tree for testing integrated circuitry. However, when serially connecting multiple stages of XOR or XNOR gates, a complex arrangement of PFETs and NFETs is required which is non-optimal for efficient use of available circuit area and which may produce undesirable sensitivity to noise and reduction in processing speed. Thus, more efficient logic topologies are desirable which are less sensitive to noise, offer improved speed of operation, and make more efficient use of available circuit area.

BRIEF SUMMARY OF THE INVENTION

The present invention solves the foregoing problems by providing a method for configuring a n-way XOR/XNOR circuit comprising providing a plurality of top stacks of PFETs each including at least three PFETs electrically connected between a high logic level and an output logic connection, providing a plurality of bottom stacks of NFETs each including at least three NFETs electrically connected between a low logic level and the output logic connection, connecting a source or a drain of the outermost PFET in each top stack to a source or a drain of a corresponding NFET in each bottom stack to generate inverted logic signals, inputting at least three input logic states to the stacks of PFETs to selectively connect or disconnect the output logic connection to the high logic level, inputting at least three input logic states to the stacks of NFETs to selectively connect or disconnect the output logic connection to the low logic level, and outputting a logic signal from the output logic connection.

BRIEF DESCRIPTION OF THE DRAWINGS

For the purpose of illustrating the invention, the drawings show aspects of one or more embodiments of the invention. However, it should be understood that the scope of the present invention is not limited to embodiments in the figures.

FIGS. 1a-1c illustrate examples of equivalent circuit arrangements for a three input logic function constructed from PFETs and NFETs.

DETAILED DESCRIPTION OF THE INVENTION

Figure 2:
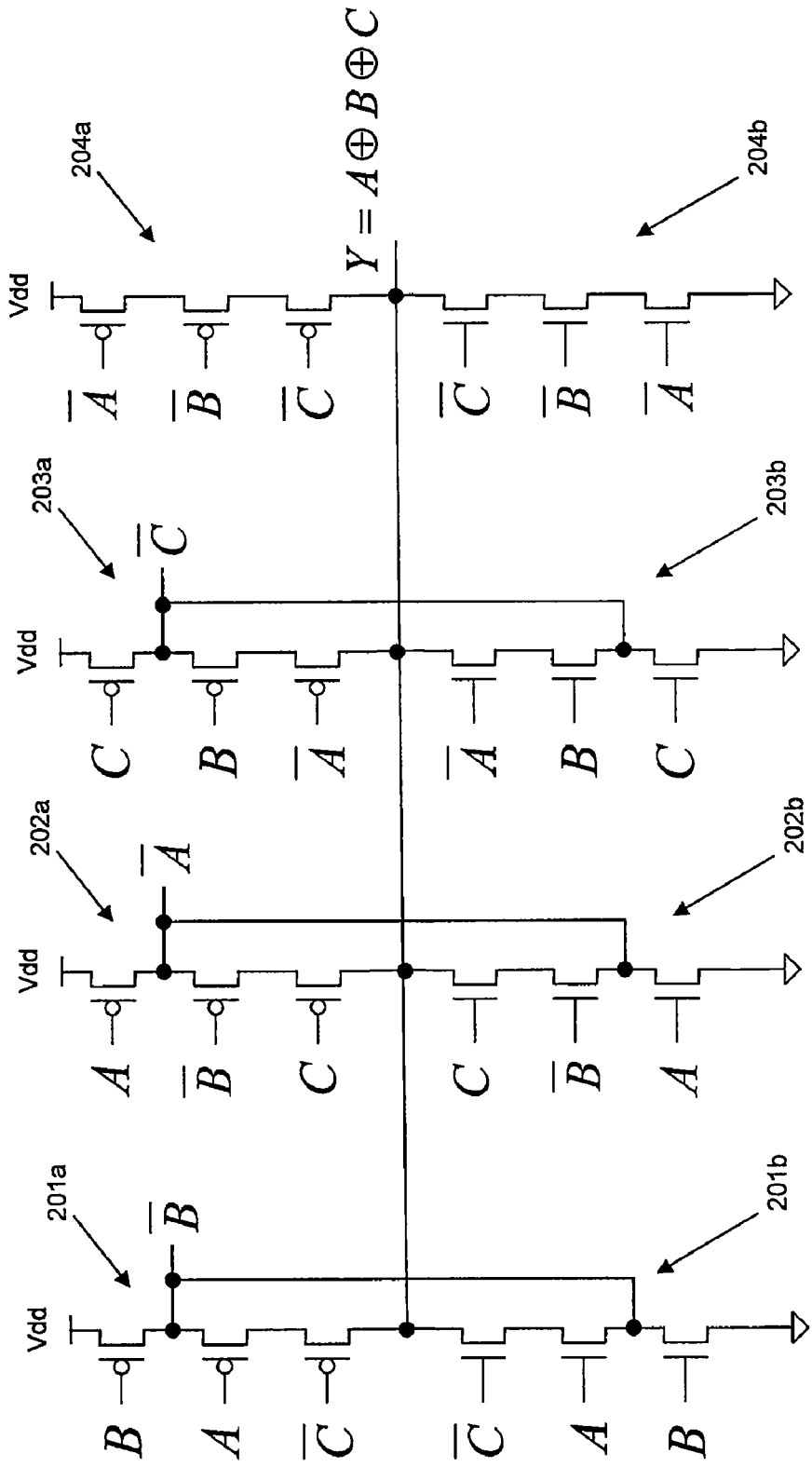
FIG. 2 illustrates an example of a 3-way XOR circuit in accordance with the present invention.

The present invention generally comprises a new topology to implement an n-way XOR/XNOR in a single step. The proposed topology may be at least as fast and have less sensitivity to noise than other solutions. The proposed topology may also be faster than other solutions that have the same noise sensitivity. In particular, the topology introduces stacks of NFET/PFET devices which are increased to groups of three or more. Common topologies for 2-way XOR/XNOR circuits may vary according to technical requirements and available technology. However, they all share the common goal of implementing the truth table as indicated by TABLE 1.

TABLE 1

| (2-way XOR/XNOR logic) | | | |
| --- | --- | --- | --- |
| A | B | $Y = A \oplus B_{(2\text{-way } XOR)}$ | $Y = \overline{A \oplus B}_{(2\text{-way } XNOR)}$ |
| 0 | 0 | 0 | 1 |
| 0 | 1 | 1 | 0 |
| 1 | 0 | 1 | 0 |
| 1 | 1 | 0 | 1 |

A truth table such as TABLE 1 may be implemented using PFET and NFET circuit elements which form the basis of CMOS logic. If a gate of a PFET is set to "0" (a low logic voltage), the PFET switches to a closed state which electrically connects the PFETs drain and source. However, if the gate of a PFET is instead set to "1" (a high logic voltage), the PFET switches to an open state and its drain and source pins are not connected. In a similar fashion, if the gate of a NFET is set to "1" (a high logic voltage), the NFET switches to a closed state electrically connecting the drain and source. If the gate of a NFET is instead set to "0" (a low logic voltage), the NFET is open and its drain and source pins are not connected. This basic operation is summarized in TABLE 2.

TABLE 2

| Gate input | PFET | NFET |
| --- | --- | --- |
| 0 | closed | open |
| 1 | open | closed |

Common practice is to use NFET devices to pull an output pin to "0" and to use PFET devices to pull an input pin to "1". Therefore, PFET devices may be placed between the output logic pin and "1" (voltage power) and NFET devices may be placed between the output logic pin and "0" (ground power). While different common topologies exist to implement two-way XOR/XNOR circuits, they all share the feature that at most 2 devices of the same type are "stacked". This means that no more than 2 of these devices are connected to each other at drain/source between power or ground and the output. However, by increasing the number of PFETs and NFETs used in the stacks more complex logic functions may be generated.

FIGS. 1a-1c illustrate various examples of implementing the logic function $Y = \overline{ABC}$ in which the logic output Y achieves a high logic level only when both logic inputs A, B are at a low logic level and logic input C is at a high logic level. In FIG. 1a, an upper stack of PFETs 101a are electrically connected between a high voltage logic state Vdd and a logical output connection Y and a lower stack of NFETs 101b are electrically connected between the logical output connection Y and a low voltage logic state such as ground. When logic inputs A and B are at a low logic level the associated PFETs of top stack 101a both turn on while when logic input C is at a high logic level the inverted input $\overline{C}$ is at low logic level and turns on the associated PFET. For the bottom stack 101b the same inputs turn off each of the NFETs in the stack. The net result of this configuration is that the logic output Y is electrically connected to Vdd only in the case in which A=0, B=0, and C=1. In the configuration as shown in FIG. 1a, an additional wire 110 may connect the outermost PFET and the outermost NFET. This connection is an inverted input signal (in this case $\overline{B}$). Thus no external inversion is required and the outermost FETs in the circuit can serve both to create a desired logic function and provide an internal inverting circuit.

FIG. 1b illustrates an equivalent example of implementing the logic function Y=$\overline{ABC}$ with upper PFET stack 102a and lower NFET stack 102b. In this case input logic signal A is inverted. Similarly FIG. 1c illustrates an example with the C logic input being inverted. Thus, rearrangements of the PFETs (or NFETs) in a particular stack would be equivalent to achieve the same logic function and may be performed to invert different inputs.

TABLE 3 illustrates the truth table for 3-way XOR and XNOR logic. In the case of the 3-way XOR logic there are 8 (=$2^3$) possible combinations of inputs. A high voltage output (logic "1") occurs in half of the possible outputs, while a low voltage output (logic "0") occurs in the other half of the possible outputs. Input connections for stacks of PFETs or NFETs used in a variety of logic architectures may be selected based upon the logic outputs states of truth table such as TABLE 3.

TABLE 3

(3-way XOR/XNOR logic)

| A | B | C | Y = A ⊕ B ⊕ C$_{(3\text{-way XOR})}$ | Y = $\overline{A \oplus B \oplus C}_{(3\text{-way XNOR})}$ |
|---|---|---|---|---|
| 0 | 0 | 0 | 0 | 1 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 0 |

Figure 3:
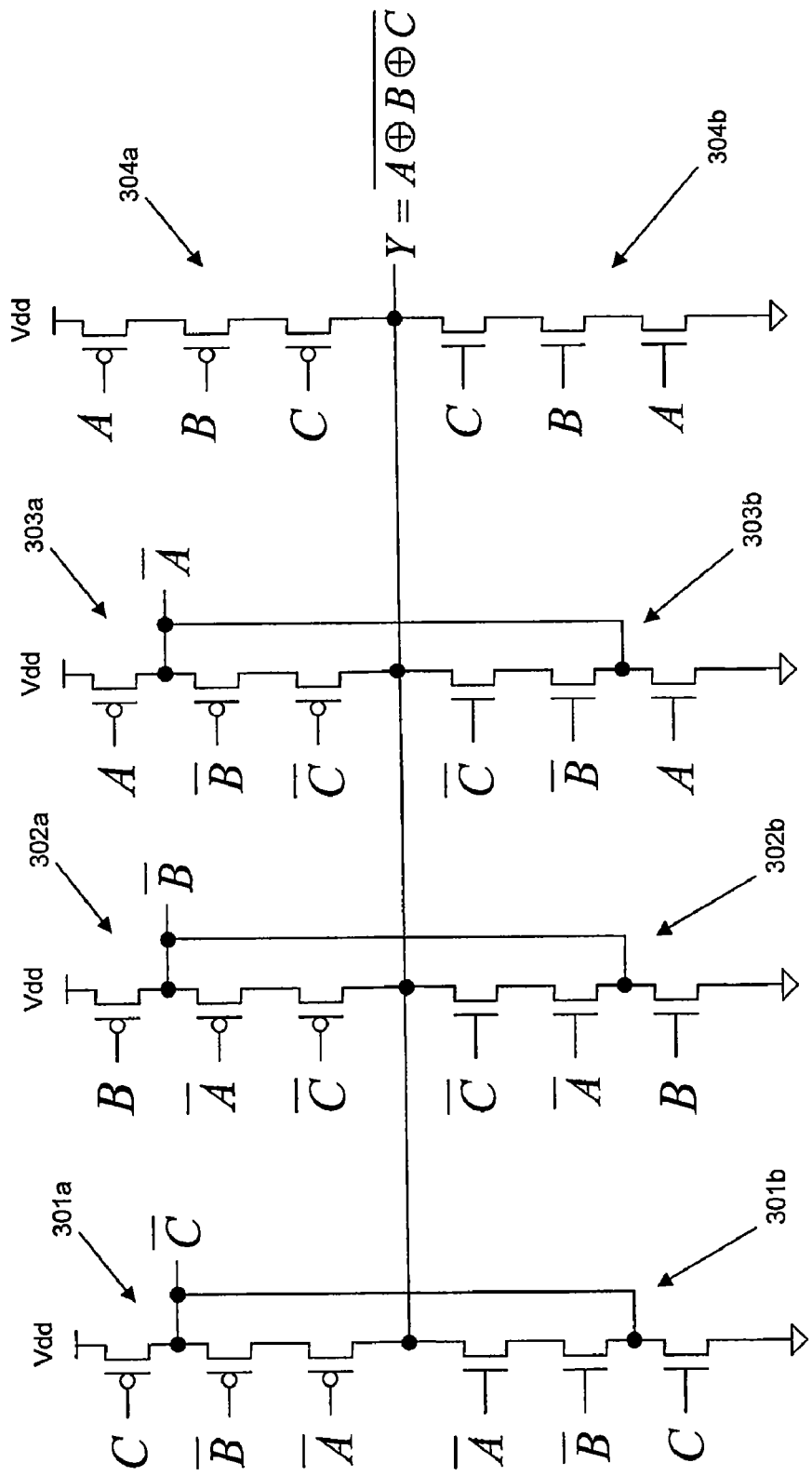
FIG. 3 illustrates an example of a 3-way XNOR circuit in accordance with the present invention.

FIGS. 2 and 3 generally illustrate embodiments of the present invention in which XOR and XNOR functions are implemented that include only three logic inputs. In particular, FIG. 2 illustrates an example of a 3-way XOR circuit and FIG. 3 illustrates an example of a 3-way XNOR circuit.

As illustrated in FIG. 2, the selection of inputs to each stack may be selected in accordance with the XOR truth table of TABLE 3. For example, stack 201b corresponds to the logic inputs A=1, B=1, C=0, stack 202b corresponds to the logic inputs A=1, B=0, C=1, stack 203b corresponds to the logic inputs A=0, B=1, C=1, and stack 204b corresponds to the logic inputs A=0, B=0, C=0. This connection arrangement assures that the output logic connection Y is pulled down to the low logic state (e.g. ground) for any of these inputs. Similarly, input connections may be selected for the upper stacks based on the logic input states that pull the output logic connection Y to the high voltage state Vdd. For example, stack 201a corresponds to the logic inputs A=1, B=0, C=1, stack 202a corresponds to the logic inputs A=0, B=1, C=0, stack 203a corresponds to the logic inputs A=1, B=0, C=0, and stack 204a corresponds to the logic inputs A=1, B=1, C=1. This connection arrangement assures that the output logic connection Y is pulled up to the high logic state for any of these inputs.

As illustrated in FIG. 3, the selection of the input logic connections may similarly be made for 3-way XNOR logic based on the truth table of TABLE 3. In this case the input connections to PFET stacks 301a, 302a, 303a, and 304a are determined by the logic "1" values of the XNOR output Y in TABLE 3 and the input connections to NFET stacks 301b, 302b, 303b, and 304b are determined by the logic "0" values of the XNOR output Y in TABLE 3. It is noted that in both the embodiments of FIG. 2 and FIG. 3, the inversion of the input signals A, B, and C may be taken internally as illustrated, and thus no external inversion circuitry is necessary for the logic inputs.

Figure 4:
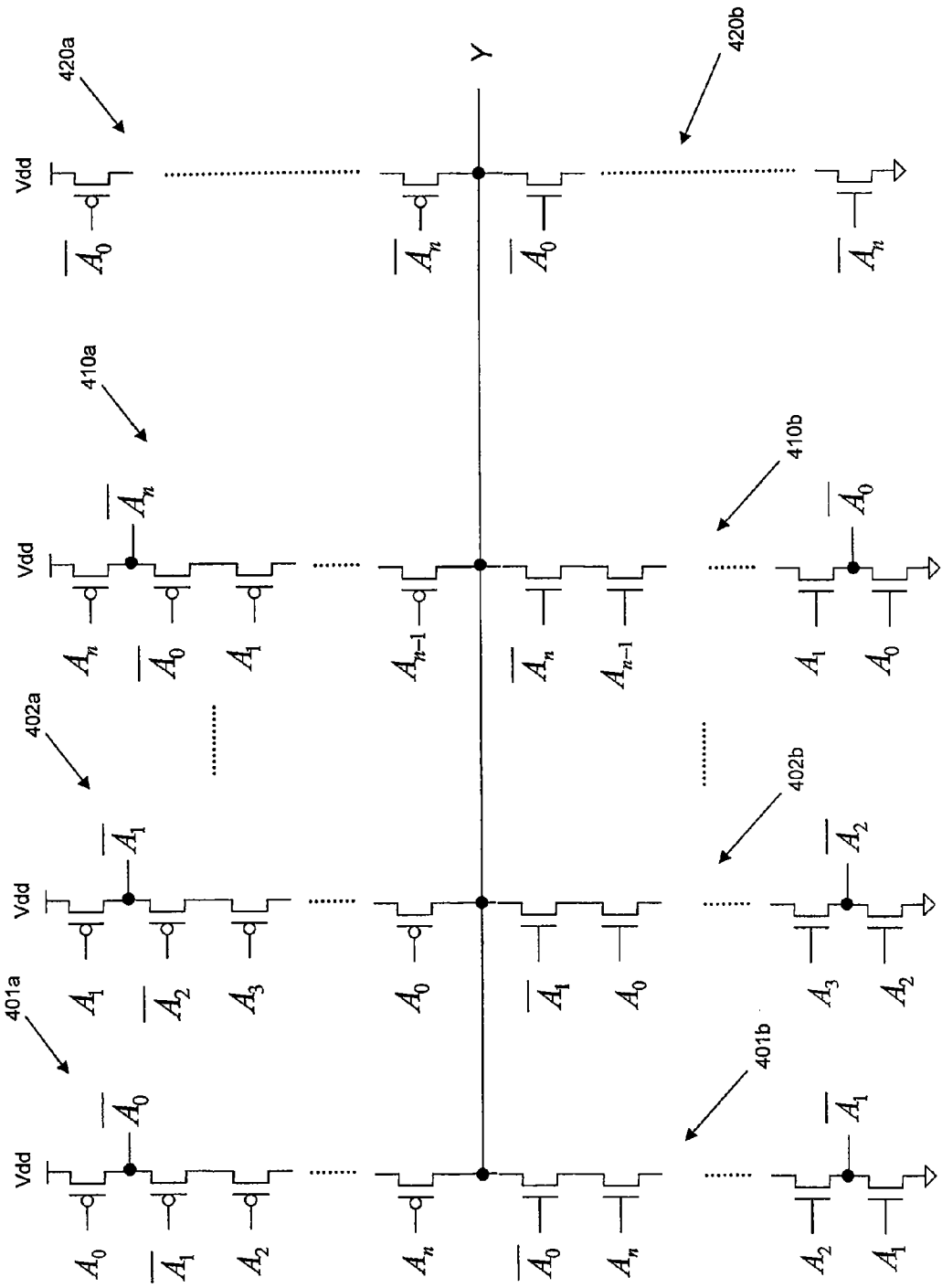
FIG. 4 illustrates an example of an n-way XOR circuit in accordance with the present invention.
Figure 5:
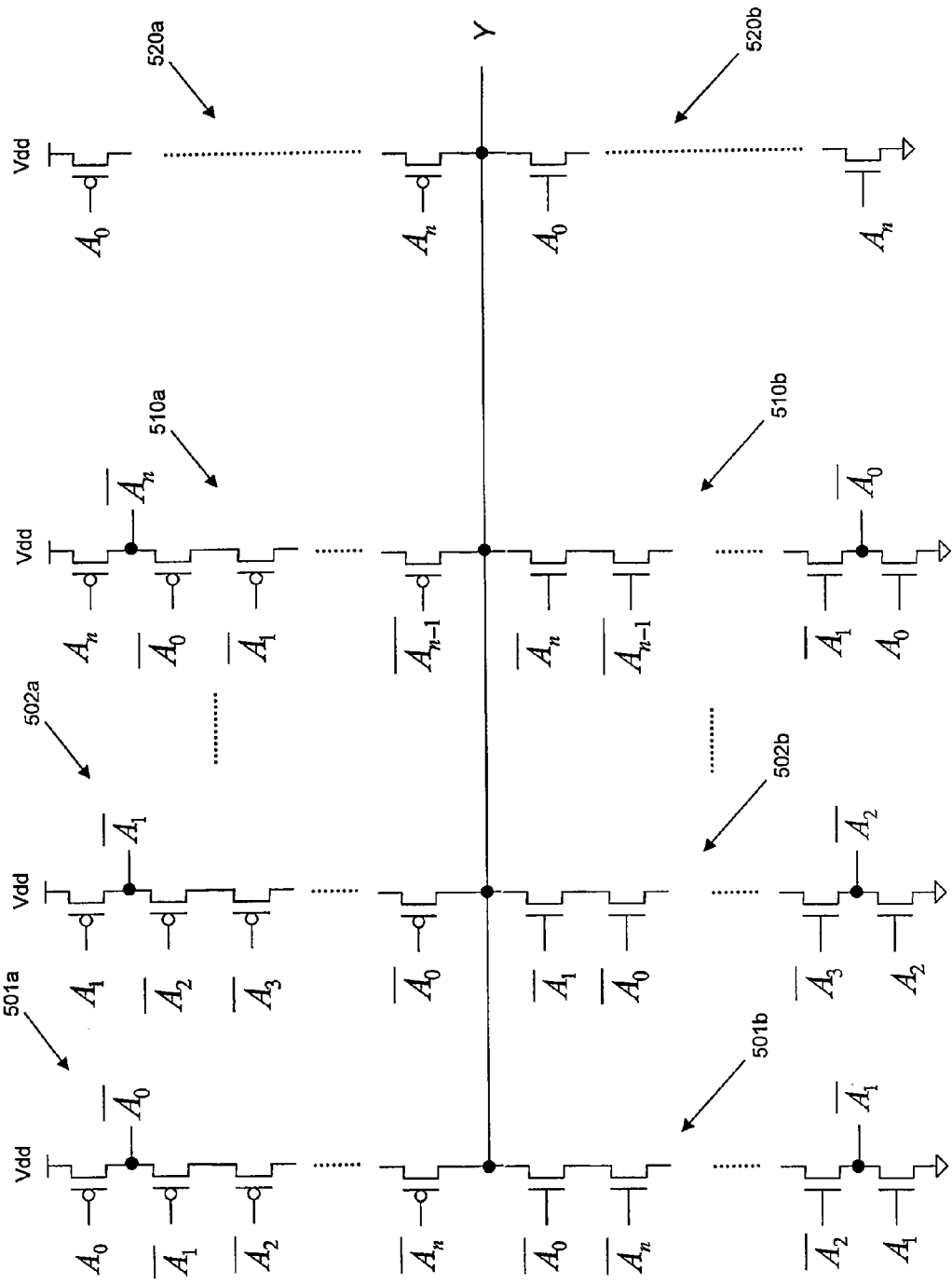
FIG. 5 illustrates an example of an n-way XNOR circuit in accordance with the present invention.

Implementation of logic functions with a larger number of logic inputs is also possible, as illustrated in FIGS. 4 and 5.

FIG. 4 illustrates an extension of the XOR circuitry to an n-way configuration including n+1 input logic signals $A_0$-$A_n$. Only one input in each stack of PFETs 401a, 402a, ..., 410a is inverted except for the last stack 420a in which all of the inputs $A_0$-$A_n$ are inverted. Similarly only one input in each stack of NFETs 401b, 402b, ..., 410b is inverted except for the last stack 420b in which all of the inputs $A_0$-$A_n$ are inverted. In this case the output logic voltage Y achieves a high voltage state either when exactly one of the input logic values is at logic "1" (with all other logic inputs=logic 0) or when all of the input logic values are at logic "1," and achieves a low voltage state either when exactly one of the input logic values is at a logic "0" (with all other logic inputs=logic 1) or when all of the input logic values are at logic "0" (in all other cases the output would be at an intermediate state since every stack would have at least one open PFET or NFET).

FIG. 5 illustrates an extension of XNOR circuitry to a n-way configuration including n+1 input logic signals $A_0$-$A_n$. All but one input in each stack of PFETs 501a, 502a, ..., 510a is inverted except for the last stack 520a in which none of the inputs $A_0$-$A_n$ are inverted. Similarly all but one input in each stack of NFETs 501b, 502b, ..., 510b is inverted except for the last stack 520b in which none of the inputs $A_0$-$A_n$ are inverted. In this case the output logic voltage Y achieves a high voltage state either when exactly one of the input logic values is at logic "0" (with all other logic inputs=logic 1) or when all of the input logic values is at logic "0," and achieves a low voltage state either when exactly one of the input logic values is at a logic "1" (with all other logic inputs=logic 0) or when all of the input logic values are at logic "1" (in all other cases the output would be at an intermediate state since every stack would have at least one open PFET or NFET).

TABLE 4 summarizes the n-way XOR/XNOR logic. It is again noted that no external inversion is necessary for these embodiments since the outputs of the outermost PFETs and NFETs may provide such inversion of the logic inputs.

TABLE 4

(n-way XOR/XNOR logic)

| $A_0$-$A_n$ | Y (n-way XOR) | Y (n-way XNOR) |
|---|---|---|
| $A_i$ = 1 for exactly one i and other $A_i$ = 0 (0 ≤ i ≤ n) | 1 | 0 |

TABLE 4-continued (n-way XOR/XNOR logic)

| $A_0$-$A_n$ | Y (n-way XOR) | Y (n-way XNOR) |
|---|---|---|
| $A_i = 0$ for exactly one i and other $A_i = 1$ ($0 \leq i \leq n$) | 0 | 1 |
| $A_i = 1$ for all i ($0 \leq i \leq n$) | 1 | 0 |
| $A_i = 0$ for all i ($0 \leq i \leq n$) | 0 | 1 |

Figure 6:
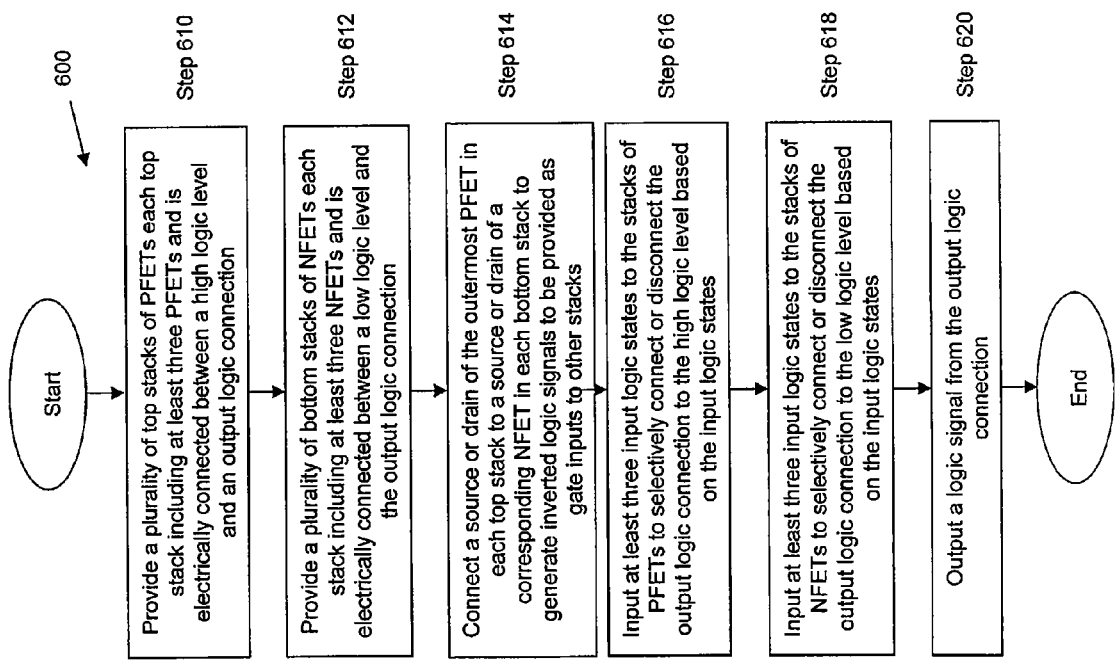
FIG. 6 illustrates a method for implementing an n-way XOR or XNOR circuit in accordance with the present invention.

FIG. 6 illustrates a flow chart detailing the basic process flow 600 of the circuit configuration of the present invention.

First, in step 610, a plurality of top stacks of PFETs are provided with each top stack including at least three PFETs electrically connected between a high logic level and an output logic connection.

Next, in step 612, a plurality of bottom stacks of NFETs are provided with each bottom stack including at least three NFETs electrically connected between a low logic level and the output logic connection.

The process 600 continues in step 614 where the source (or drain) of the outermost PFET in each top stack is connected to the drain (or source) of a corresponding NFET in each bottom stack to generate inverted logic signals to be provided as gate inputs to other stacks (which avoids the necessity of external inversion circuitry).

Then, in step 616, at least three input logic states are input to each of the multiple stacks of PFETs to selectively connect or disconnect the output logic connection to the high logic level based on the input logic states. The selection of the wiring connections between the logic input wiring and the gate connections of the stacks of PFETs may be chosen based on the logic "1" states of an associated truth table.

Thereafter, in step 618, at least three input logic states are input to each of the multiple stacks of NFETs to selectively connect or disconnect the output logic connection to the low logic level based on the input logic states. The selection of the wiring connections between the logic input wiring and the gate connections of the stacks of NFETs may be chosen based on the logic "0" states of an associated truth table.

Finally, in step 620, a logic signal is output from the output logic connection based on the configuration as described above.

As explained above, the use of multi-stacked PFET and NFET offers a new logic topology for multi-input logic structures such as n-way XOR and n-way XNOR logic gates which can be implemented in a single step without cascading 2-way XOR or XNOR circuits. The topology may provide advantages related to processing speed and noise reduction in addition to removing the necessity of external inverting circuitry by structuring the outermost PFETs and NFETs to generate inverted signals.

Although the present invention has been described with reference to preferred embodiments, workers skilled in the art will recognize that changes may be made in form and detail without departing from the spirit and scope of the invention.

What is claimed is:

1. A method for configuring a n-way XOR or XNOR circuit comprising:
   providing a plurality of top stacks of PFETs, each top stack of PFETs including at least three PFETs electrically connected between a high logic level and an output logic connection;
   providing a plurality of bottom stacks of NFETS, each bottom stack including at least three NFETs electrically connected between a low logic level and the output logic connection;
   directly connecting a source or a drain of the outermost PFET in each top stack to a source or a drain of a corresponding NFET in each bottom stack to generate inverted logic signals to be provided as gate inputs to other stacks;
   inputting at least three input logic states to the stacks of PFETs to selectively connect or disconnect the output logic connection to the high logic level based on the input logic states;
   inputting at least three input logic states to the stacks of NFETs to selectively connect or disconnect the output logic connection to the low logic level based on the input logic states; and
   outputting a logic signal from the output logic connection.

\* \* \* \* \*